(12) United States Patent
Qi et al.

(10) Patent No.: US 10,754,247 B2
(45) Date of Patent: Aug. 25, 2020

(54) MANUFACTURING METHOD FOR METAL GRATING, METAL GRATING AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Yonglian Qi, Beijing (CN); Lianjie Qu, Beijing (CN); Bingqiang Gui, Beijing (CN); Hebin Zhao, Beijing (CN); Yun Qiu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 175 days.

(21) Appl. No.: 15/941,920

(22) Filed: Mar. 30, 2018

(65) Prior Publication Data
US 2019/0041746 A1 Feb. 7, 2019

(30) Foreign Application Priority Data
Aug. 2, 2017 (CN) .......................... 2017 1 0652740

(51) Int. Cl.
| | | |
|---|---|---|
| G03F 7/09 | (2006.01) | |
| G03F 7/20 | (2006.01) | |
| G03F 7/42 | (2006.01) | |
| G02B 5/18 | (2006.01) | |
| G02B 5/30 | (2006.01) | |
| G02F 1/1335 | (2006.01) | |
| H01L 51/52 | (2006.01) | |
| C23F 4/00 | (2006.01) | |
| G03F 7/00 | (2006.01) | |

(52) U.S. Cl.
CPC .............. *G03F 7/0007* (2013.01); *C23F 4/00* (2013.01); *G02B 5/18* (2013.01); *G02B 5/3025* (2013.01); *G02F 1/133528* (2013.01); *G03F 7/091* (2013.01); *G03F 7/094* (2013.01); *G03F 7/2004* (2013.01); *G03F 7/427* (2013.01); *H01L 51/5281* (2013.01); *G02F 2001/133548* (2013.01); *G02F 2001/133565* (2013.01); *G02F 2201/30* (2013.01)

(58) Field of Classification Search
None
See application file for complete search history.

(56) References Cited

U.S. PATENT DOCUMENTS

| | | | | |
|---|---|---|---|---|
| 2005/0287479 A1* | 12/2005 | Moon | ..................... | G03F 7/091 430/330 |
| 2011/0159253 A1* | 6/2011 | Kang | ........................ | G03F 7/09 428/195.1 |
| 2019/0049789 A1* | 2/2019 | Markle | .................... | G03F 7/322 |

FOREIGN PATENT DOCUMENTS

DE            10054969        *  3/2002   ......... H01L 21/3213

OTHER PUBLICATIONS

Li et al., "Nano-scale patterns of molybdenum on glass substrates for use in super-resolution imaging with metamaterials", Proc. SPIE vol. 9163 (91631D (8 pages) (2014).*
Cannistra, "Design, Fabrication and testing of hierarchial micro-optical structure and systems", Theses UNC—Charlotte (2001).*
Choi et al. "Investigation on fabrication of nanoscale patterns using laser interference lithography", J. Nanosci. Nanotech., vol. 11 pp. 778-781 (2011).*
Amalathas, "Fabrication of photonic nanostructures for light harvesting in solar cells", Thesis, Univ. Canterbury, Christchurch NZ (May 2017).*
van Wolferen et al., "Laser interference Lithography" in "lithography principles, processes and materials", T.C. Hennessy, Ed., pp. 133-148 (2011).*
Walsh, "Nanostructuring magnetic thin films using interference lithography", Thesis, MIT (Aug. 2000).*
Xu et al., "Reacting ion beam etching of large diffraction gratings", 50thAnn., Tech. Confer. Proc., Soc. Vac. Coat., 8 pages (2007).*
Schattenburg et al., "Optically matched trilevel resist process for nanostructure fabrication", J Vac. Sci. Technol., B., vol. 13(6) pp. 3007-3011 (Nov. 12, 1995).*
Savas et al., "Larger scale achromatic interfgerometric lithography for 100 nm period gratings and grids"., J Vac. Sci. Technol., B, vol. 14(6) pp. 4167-4170 (Nov. 12, 1996).*
Palmer "Diffraction grating handbook", 7th Ed., Newport Corp., 265 pages (2014).*

* cited by examiner

*Primary Examiner* — Martin J Angebranndt
(74) *Attorney, Agent, or Firm* — Womble Bond Dickinson (US) LLP

(57) ABSTRACT

The present disclosure proposes a manufacturing method for a metal grating, a metal grating, and a display device. The manufacturing method comprises: forming a metal layer, an antireflective layer and a deep UV photoresist layer sequentially on a base substrate; etching the deep UV photoresist layer by a photolithography process, so as to form a grating mask pattern; etching the antireflective layer by a dry etching process with the help of the grating mask pattern, so as to form an etch mask pattern identical to the grating mask pattern; peeling off the grating mask pattern; etching the metal layer by a dry etching process with the help of the etch mask pattern, so as to form metal grating strips; and removing the etch mask pattern, thus forming a metal grating.

7 Claims, 11 Drawing Sheets

MANUFACTURING METHOD FOR METAL GRATING, METAL GRATING AND DISPLAY DEVICE

CROSS REFERENCE TO RELATED APPLICATIONS

The present application claims the priority of the Chinese patent application No. 201710652740.7 filed on Aug. 2, 2017, the entire disclosure of which is incorporated herein by reference.

TECHNICAL FIELD

The present disclosure relates to the field of display technologies, and specifically to a manufacturing method for a metal grating, a metal grating, and a display device.

BACKGROUND ART

At present, in a flat panel display, for fabricating a built-in polarizer, a dichroic dye is usually used as a main component of the polarizer, and applied inside a liquid crystal cell by spin-coating, so as to form the built-in polarizer. Due to limitations of the material, a polarizer formed in this way has only a polarization degree of 80%, which is far from the polarization degree of 99.99% as required by a display panel. Therefore, it cannot be applied in an actual product.

As an alternative formation approach, the built-in polarizer can also be formed by nano-imprinting. However, the nano-imprinting procedure has a lower yield rate and involves more complicated processes. This results in a higher fabricating cost and greater development difficulty. Besides, during the nano-imprinting procedure, the product yield rate drops rapidly as the resolution rises.

Besides, as a further option, it is proposed that the metal grating can also be manufactured by Talbot deep UV exposure. However, such a manufacturing method involves quite complicated steps.

SUMMARY

According to one aspect of the present disclosure, a manufacturing method for a metal grating is provided in an embodiment. Specifically, the manufacturing method comprises: forming a metal layer, an antireflective layer and a deep UV photoresist layer sequentially on a base substrate; etching the deep UV photoresist layer by a photolithography process, so as to form a grating mask pattern; etching the antireflective layer by a dry etching process with the help of the grating mask pattern, so as to form an etch mask pattern identical to the grating mask pattern; peeling off the grating mask pattern; etching the metal layer by a dry etching process with the help of the etch mask pattern, so as to form metal grating strips; and removing the etch mask pattern, thus forming a metal grating.

According to a possible implementation, in the manufacturing method provided by an embodiment of the present disclosure, the etch mask pattern is removed by a plasma process.

According to a possible implementation, in the manufacturing method provided by an embodiment of the present disclosure, a protective film is formed on the metal grating strips while the etch mask pattern is removed by the plasma process.

According to a possible implementation, in the manufacturing method provided by an embodiment of the present disclosure, oxidization treatment is performed on a surface of the metal grating strips by using oxygen plasmas, so as to form the protective film.

According to a possible implementation, the manufacturing method provided by an embodiment of the present disclosure further comprises: after the formation of the antireflective layer and prior to the formation of the deep UV photoresist layer, forming a hard mask layer on the antireflective layer; etching the antireflective layer and the hard mask layer simultaneously by a dry etching process with the help of the grating mask pattern, so as to form the etch mask pattern and a hard mask pattern identical to the etch mask pattern; and after the formation of the metal grating strips and prior to the removal of the etch mask pattern, removing the hard mask pattern.

According to a possible implementation, in the manufacturing method provided by an embodiment of the present disclosure, an etch selectivity between the deep UV photoresist layer and the antireflective layer is not smaller than a predetermined threshold.

According to a possible implementation, in the manufacturing method provided by an embodiment of the present disclosure, an etch selectivity between the deep UV photoresist layer and the antireflective layer is not smaller than that between the deep UV photoresist layer and the hard mask layer.

According to a possible implementation, in the manufacturing method provided by an embodiment of the present disclosure, the antireflective layer comprises a plurality of antireflective sublayers with different refractive indexes.

According to a possible implementation, in the manufacturing method provided by an embodiment of the present disclosure, in a direction from the metal layer to the deep UV photoresist layer, the refractive index of the (2n)th antireflective sublayer is smaller than that of the (2n−1)th antireflective sublayer and that of the (2n+1)th antireflective sublayer, wherein n is an integer greater than or equal to 1. Alternatively, in another embodiment, in a direction from the metal layer to the deep UV photoresist layer, the refractive index of the (2n)th antireflective sublayer is greater than that of the (2n−1)th antireflective sublayer and that of the (2n+1)th antireflective sublayer, wherein n is an integer greater than or equal to 1.

According to another aspect of the present disclosure, a metal grating is further provided in an embodiment. Specifically, the metal grating is manufactured by using the manufacturing method provided by an embodiment of the present disclosure.

According to yet another aspect of the present disclosure, a display device is further provided in an embodiment. Specifically, the display device comprises: a display panel; and the metal grating as mentioned above, wherein the metal grating is arranged inside the display panel as a polarizer.

According to a possible implementation, in the display device provided by an embodiment of the present disclosure, the display panel is a liquid crystal display panel. In this case, the liquid crystal display panel comprises: a counter substrate and an array substrate arranged opposite to each other; a liquid crystal layer arranged between the counter substrate and the array substrate; and the metal grating as mentioned above. The metal grating specifically comprises: a first metal grating arranged on one side of the array substrate facing the liquid crystal layer; and a second metal grating arranged on one side of the counter substrate facing the liquid crystal layer, wherein an extension direction of the first metal grating is perpendicular to that of the second metal grating.

According to a possible implementation, in the display device provided by an embodiment of the present disclosure, the display panel is an organic electroluminescent display panel. In this case, the organic electroluminescent display panel comprises: a base substrate; a light emitting device arranged on the base substrate; an encapsulation layer covering the light emitting device; the metal grating as mentioned above; and a quarter-wave plate. Furthermore, the metal grating is arranged between the encapsulation layer and the light emitting device, and the quarter-wave plate is arranged between the light emitting device and the metal grating.

DETAILED DESCRIPTION OF THE EMBODIMENTS

Figure 1:
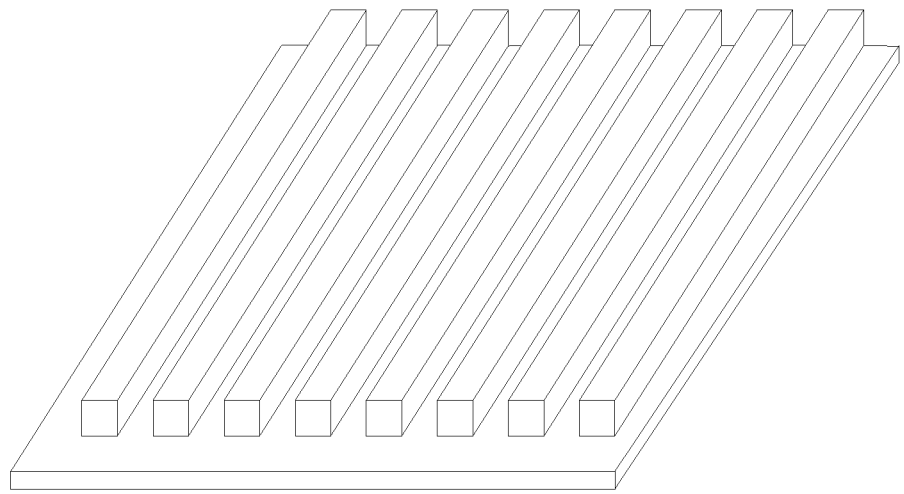
FIG. 1 shows a schematic structure view for a typical metal grating.

It should be pointed out that, in the drawings, thicknesses, shapes and dimensions of each thin film do not reflect the real ratio of the metal grating. Instead, they are only provided to schematically illustrate contents of the present disclosure.

Referring to FIG. 1, a schematic structure view for a typical metal grating is shown. Specifically, as shown in FIG. 1, the metal grating can be used as a built-in polarizer inside a display device.

In the following, the procedure for manufacturing a metal grating by a conventional Talbot deep UV exposure approach will be introduced briefly with reference to FIGS. 2a-2j. The procedure mainly comprises stages as follows.

Figure 2A:
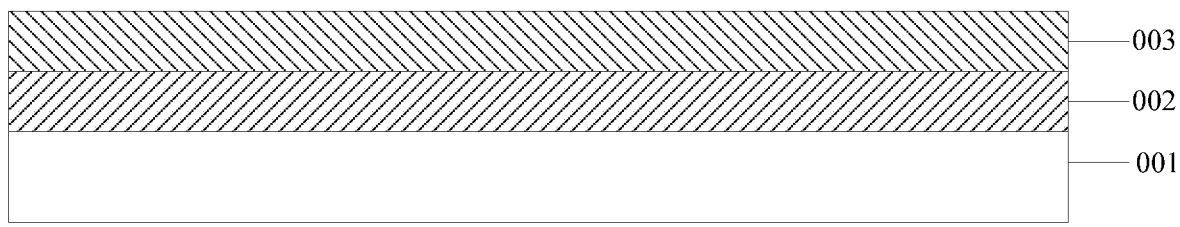
FIGS. 2a-2j are respectively schematic structure views at different stages during the manufacture of a metal grating by a conventional Talbot deep UV exposure approach.

1. Forming a metal layer 002 and a hard mask layer 003 sequentially on a base substrate 001, as shown in FIG. 2a.

Figure 2B:
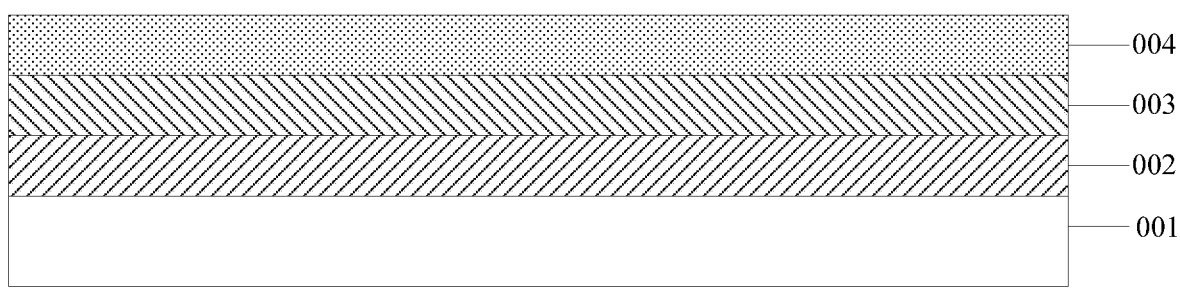

2. Forming an antireflective layer 004 on the hard mask layer 003, as shown in FIG. 2b.

Figure 2C:
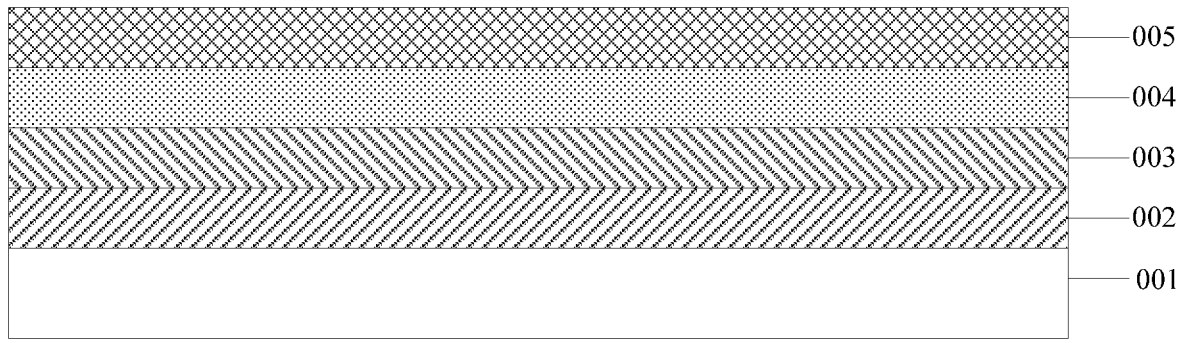

3. Forming a deep UV photoresist layer 005 on the antireflective layer 004, as shown in FIG. 2c.

Figure 2D:
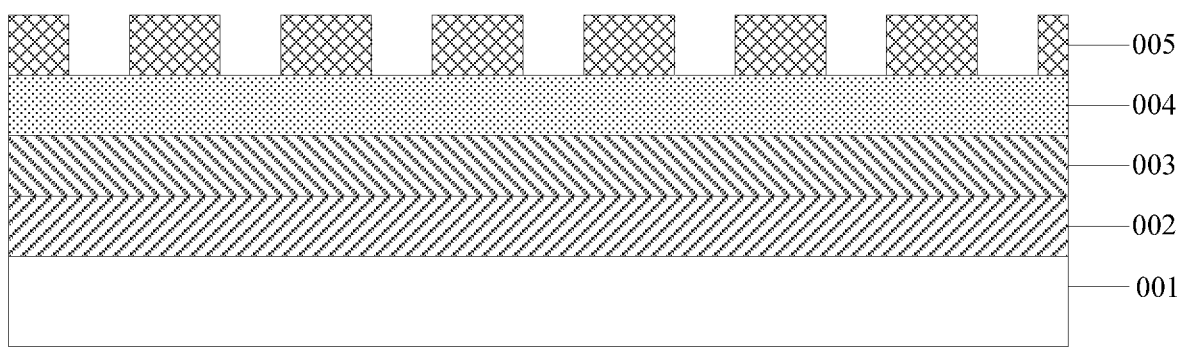

4. Etching the deep UV photoresist layer 005 by a photolithography process to form a grating mask pattern, as shown in FIG. 2d.

Figure 2E:
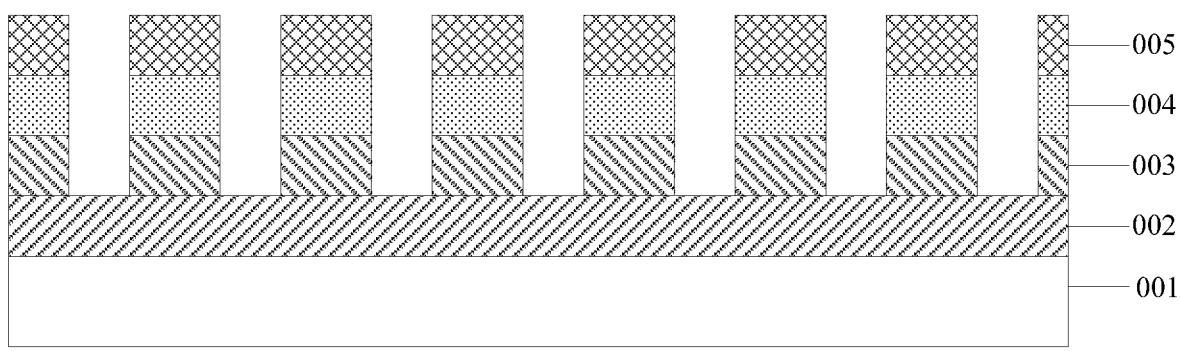

5. Etching the hard mask layer 003 and the antireflective layer 004 by a photolithography process with the help of the grating mask pattern, so as to form a hard mask pattern and an etch mask pattern identical to the grating mask pattern (respectively corresponding to a portion of the hard mask layer 003 and a portion of the antireflective layer 004 remaining after etching), as shown in FIG. 2e.

Figure 2F:
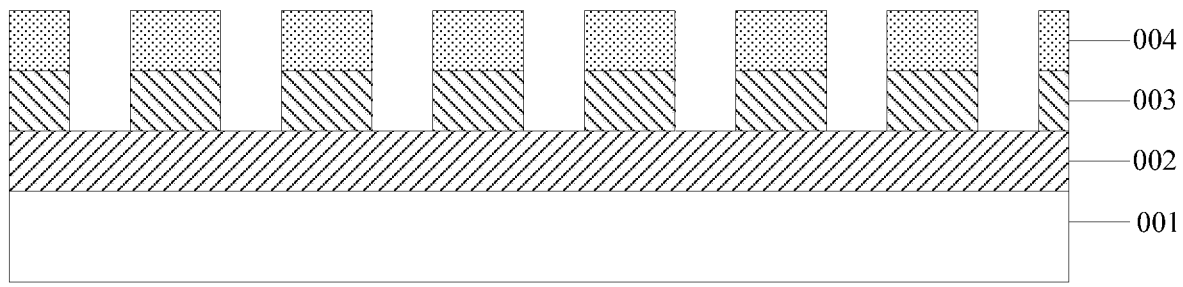

6. Peeling the portion of the deep UV photoresist layer 005 forming the grating mask pattern, as shown in FIG. 2f.

Figure 2G:
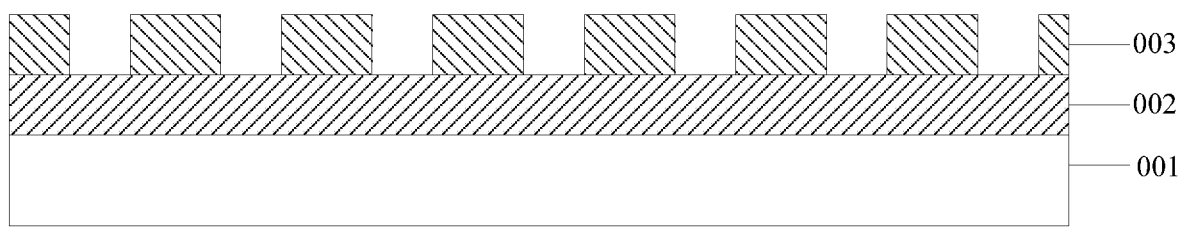

7. Peeling by using oxygen the portion of the antireflective layer 004 forming the etch mask pattern, as shown in FIG. 2g.

Figure 2H:
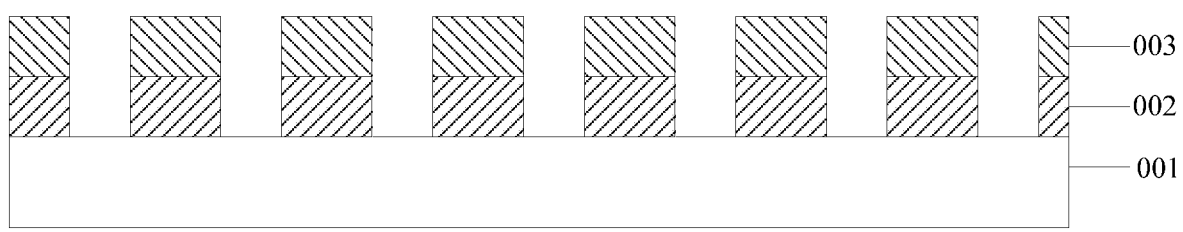

8. Etching the metal layer 002 by a dry etching process with the help of the hard mask pattern, as shown in FIG. 2h.

Figure 2I:
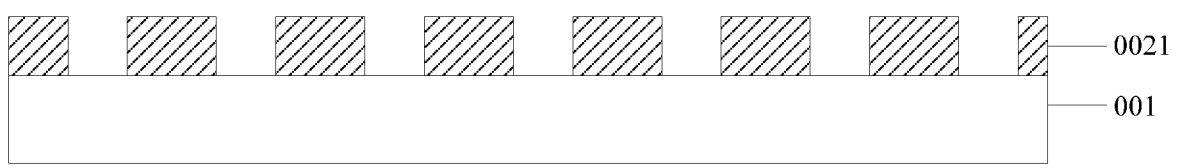

9. Removing the hard mask pattern by a dry etching process for example, to form metal strips 0021, as shown in FIG. 2i.

Figure 2J:
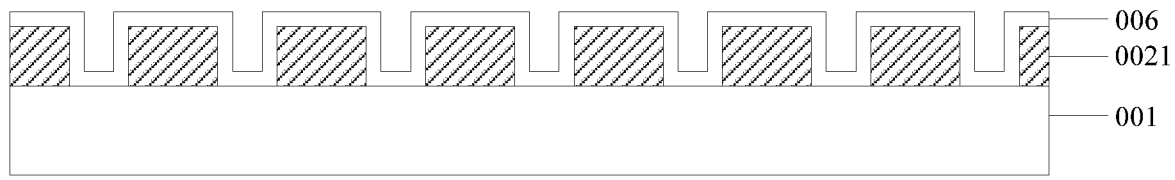

10. Forming a protective layer 006 over the metal strips 0021 to finally form a metal grating, as shown in FIG. 2j.

As can be seen, the procedure for manufacturing a metal grating by a conventional Talbot deep UV exposure approach involves quite complicated steps.

In view of above, an embodiment of the present disclosure provides a manufacturing method for a metal grating, a metal grating and a display device, in order to optimize the manufacturing steps, thereby simplifying the manufacturing procedure and improving the production efficiency.

Specific implementations of the manufacturing method for a metal grating, the metal grating and the display device provided in embodiments of the present disclosure will be described below in detail with reference to the drawings.

Figure 3:
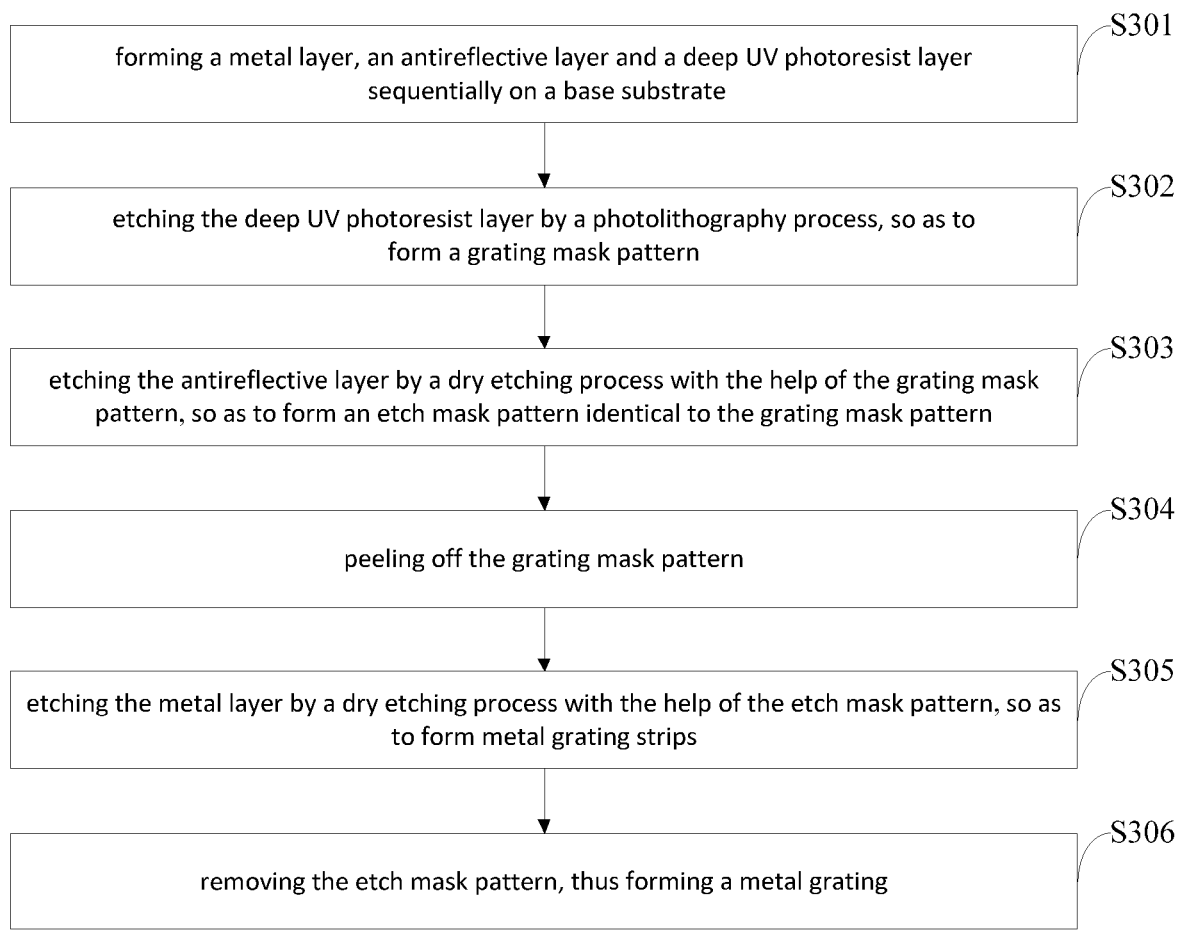
FIGS. 3-4 are respectively flow diagrams of a manufacturing method for a metal grating according to an embodiment of the present disclosure.

Specifically, a manufacturing method for a metal grating is provided in an embodiment of the present disclosure. As shown in FIG. 3, the manufacturing method can specifically comprise steps as follows.

S301, forming a metal layer, an antireflective layer and a deep UV photoresist layer sequentially on a base substrate. Generally, the metal layer can be made of materials such as Ag, Al, Mo and Cu.

S302, etching the deep UV photoresist layer by a photolithography process to form a grating mask pattern.

S303, etching the antireflective layer by a dry etching process with the help of the grating mask pattern, so as to form an etch mask pattern identical to the grating mask pattern.

S304, peeling off the grating mask pattern.

S305, etching the metal layer by a dry etching process with the help of the etch mask pattern, so as to form metal grating strips.

S306, removing the etch mask pattern to form a metal grating.

Optionally, the etch mask pattern is removed by a plasma process. Further optionally, a protective film is formed over a surface of the metal grating strips while the etch mask pattern is removed by the plasma process.

According to the manufacturing method for a metal grating provided by an embodiment of the present disclosure, an optical Talbot effect is utilized when a photolithography process is performed on the deep UV photoresist layer. Therefore, by forming an antireflective layer on a surface of the metal layer, it is guaranteed that the optical intensity of the deep UV light impinging on the deep UV photoresist layer and the distribution thereof will not be influenced when the photolithography process is performed. As compared with a conventional manufacturing approach in which the antireflective layer is arranged above the hard mask and not in contact with the metal layer, in an embodiment of the present disclosure, the antireflective layer is directly formed over the metal layer. Therefore, in the subsequent plasma process for example, a protective film can formed on a surface of the metal strips simultaneously when the etch mask pattern is removed. In this way, a conventional separate step for forming a protective layer can be omitted, which can simplify the manufacturing steps and improve the production efficiency.

Steps in the manufacturing method provided by an embodiment of the present disclosure will be explained below in detail.

Figure 4:
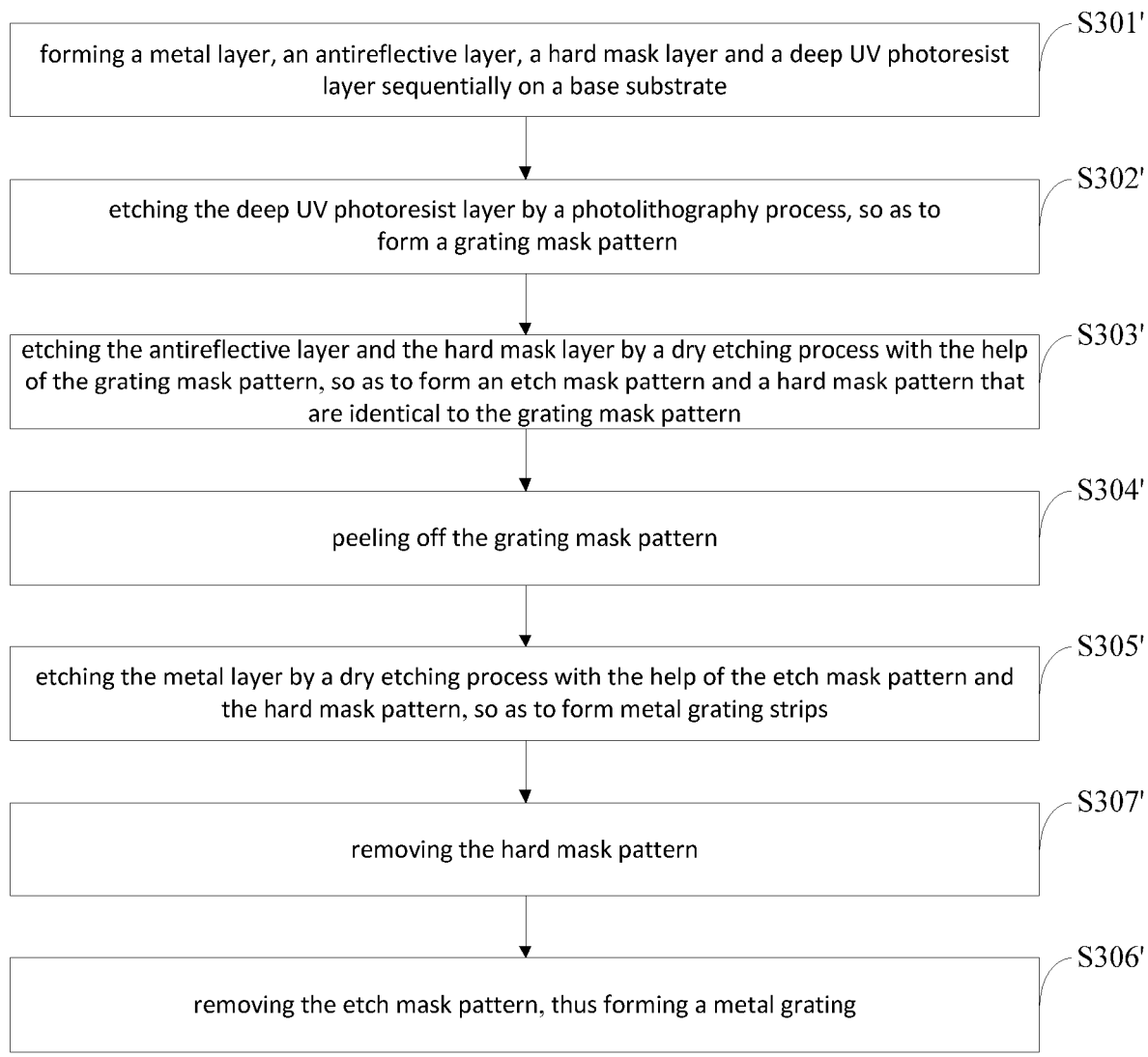

According to a specific example, in the manufacturing method provided by an embodiment of the present disclosure, as shown in FIG. 4, after forming an antireflective layer and prior to forming a deep UV photoresist layer in step S301, an additional step can be further comprised: forming a hard mask layer on the antireflective layer. This means that S301 becomes step S301', wherein a metal layer, an antireflective layer, a hard mask layer and a deep UV photoresist layer are formed sequentially on a base substrate. As compared with a conventional manufacturing method, in an embodiment of the present disclosure, the sequence in which the antireflective layer and the hard mask layer are manufactured is adjusted. Specifically, the sequence is changed from manufacturing the hard mask layer before the antireflective layer to manufacturing the antireflective layer after the the antireflective layer.

According to a specific example, in the manufacturing method provided by an embodiment of the present disclosure, the hard mask player can be made of for example $SiO_2$.

Now, for the case in FIG. 3, in an embodiment, the deep UV photoresist layer is etched by a photolithography process to form a grating mask pattern, i.e., step S302'.

Correspondingly, in the manufacturing method provided by an embodiment of the present disclosure, in step S303', the antireflective layer and the hard mask layer are etched simultaneously by a dry etching process with the help of the grating mask pattern, as shown in FIG. 4. This means that the antireflective layer and the hard mask layer are simultaneously subjected to etching treatment by a dry etching process, thereby forming an etch mask pattern and a hard mask pattern that are identical to each other. In other words, step S303 becomes step S303', wherein the antireflective layer and the hard mask layer are etched simultaneously by a dry etching process with the help of the grating mask pattern, so as to form an etch mask pattern and a hard mask pattern that are identical to the grating mask pattern.

After that, similar to the case in FIG. 3, in an embodiment, the grating mask pattern is peeled off, i.e., step S304'.

Correspondingly, in the manufacturing method provided by an embodiment of the present disclosure, after forming the metal strips in step S305' and prior to removing the etch mask pattern by a plasma process in step S306', an addition step can be further comprised: S307', removing the hard mask pattern so as to facilitate subsequent plasma treatment on the antireflective layer, as shown in FIG. 4.

Alternatively, according to a specific example, in the manufacturing method provided by an embodiment of the present disclosure, the antireflective layer as formed in step S301 can serve as a hard mask layer at the same time. In this way, the process step of forming a hard mask layer in a conventional manufacturing method can be omitted, which further simplifies the manufacturing steps. In this case, in order to ensure that the antireflective layer can play the role of a hard mask layer, in step S301, during the sequential formation of the antireflective layer and the deep UV photoresist layer on the metal layer, an etch selectivity between the deep UV photoresist layer and the antireflective layer that have been formed can be not smaller than a predetermined threshold. In this way, it is ensured that the antireflective layer will not be etched when the deep UV photoresist layer is subjected to a photolithography process subsequently in step S302.

Furthermore, in the manufacturing method provided by an embodiment of the present disclosure, during the sequential formation of the antireflective layer and the deep UV photoresist layer on the metal layer, an etch selectivity between the deep UV photoresist layer and the antireflective layer that have been formed can be not smaller than that between the deep UV photoresist layer and the hard mask layer. In other words, an etch selection is made for the material of the antireflective layer, so as to ensure that the etch selectivity between the antireflective layer and the deep UV photoresist layer satisfies requirements of the hard mask layer.

According to a specific embodiment, for the purpose of ensuring that the antireflective layer can effectively reduce reflections on the metal layer, in the manufacturing method provided by an embodiment of the present disclosure, the antireflective layer can comprise a plurality of antireflective sublayers having different refractive indexes. This means that the antireflective layer consists of a plurality of film layers. Specifically, the total reflection between film layers having different refractive indexes can effectively prevent the deep UV light from being reflected by the metal layer onto the UV deep photoresist layer and thus affecting the photolithography process.

Furthermore, an etch selectivity between the deep UV photoresist layer and the topmost antireflective layer that have been formed can be not smaller than a predetermined threshold. By doing this, it is ensured that the underlying antireflective layer will not be etched when the deep UV photoresist layer is subjected to a photolithography process subsequently in step S302. Thereby, the antireflective layer can serve as a hard mask layer at the same time.

Specifically, in the manufacturing method provided by an embodiment of the present disclosure, a plurality of antireflective sublayers is formed sequentially on the metal layer. Specifically, this can be achieved by forming a plurality of antireflective sublayers on the metal layer sequentially from bottom to top (e.g., from the metal layer to the deep UV photoresist layer), such that the refractive index of an antireflective sublayer in an odd-numbered position is higher than that of an adjacent antireflective sublayer in an even-numbered position. In other words, the refractive indexes of the plurality of antireflective sublayers formed on the metal layer vary in a trend of high-low-high-low. A combination of film layers having such a structure has a better antireflective effect.

It should be noted that in a multilayered structure with refractive indexes varying in a trend of high-low-high-low, the refractive indexes of the antireflective sublayers in each odd-numbered position can be either the same, or different, as long as they are greater than those of the antireflective sublayers in the adjacent even-numbered positions. Likewise, the refractive indexes of the antireflective sublayers in each even-numbered position can be either the same, or different, as long as they are smaller than those of the antireflective sublayers in the adjacent odd-numbered positions. Besides, in the above manufacturing method provided by an embodiment of the present disclosure, the number of film layers forming the antireflective layer is not limited. It should be further pointed out herein that in an embodiment of the present disclosure, the refractive indexes of the plurality of antireflective sublayers can also be designed to vary from the metal layer to the deep UV photoresist layer in a trend of low-high-low-high, which should be easily understood by those skilled in the art.

According to a specific example, in the manufacturing method provided by an embodiment of the present disclosure, oxygen plasma treatment is performed in step S306, and in the meanwhile, oxidization treatment is performed on a surface of the metal grating strips by using oxygen plasmas so as to form the protective film. The plasmas generated from the plasma treatment will react with the antireflective layer, and in the meantime, oxidize a surface of the metal strips that is exposed. In this way, a layer of oxides is formed on a surface of the metal grating strips to protect the metal grating strips.

The manufacturing method provided by an embodiment of the present disclosure will be explained in detail in combination with three specific embodiments.

According to one embodiment, the antireflective layer and the hard mask layer are arranged separately. In this case, the procedure for manufacturing a metal grating will comprise process steps as follows.

Figure 5A:
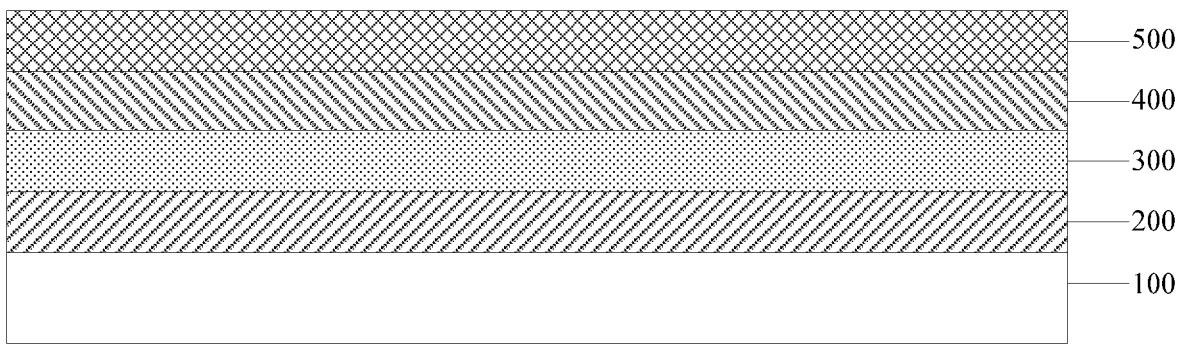
FIGS. 5a-5g are respectively schematic structure views after different steps in the manufacturing method for a metal grating according to an embodiment of the present disclosure.
Figure 5B:
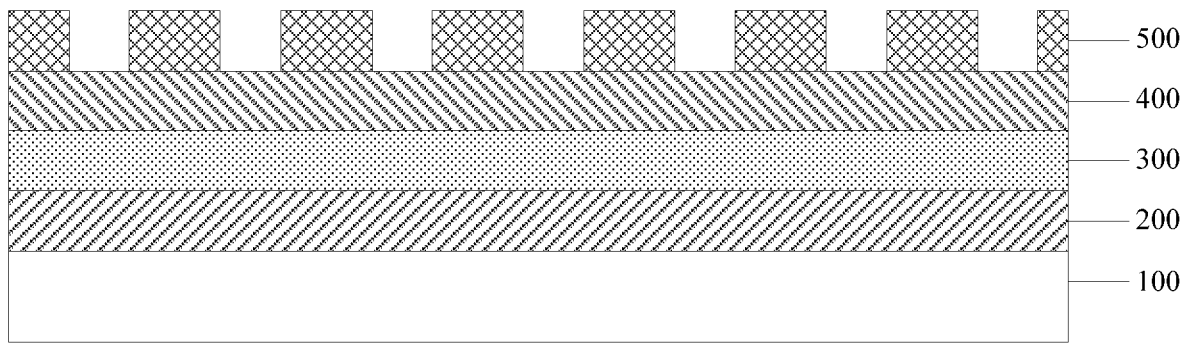
Figure 5C:
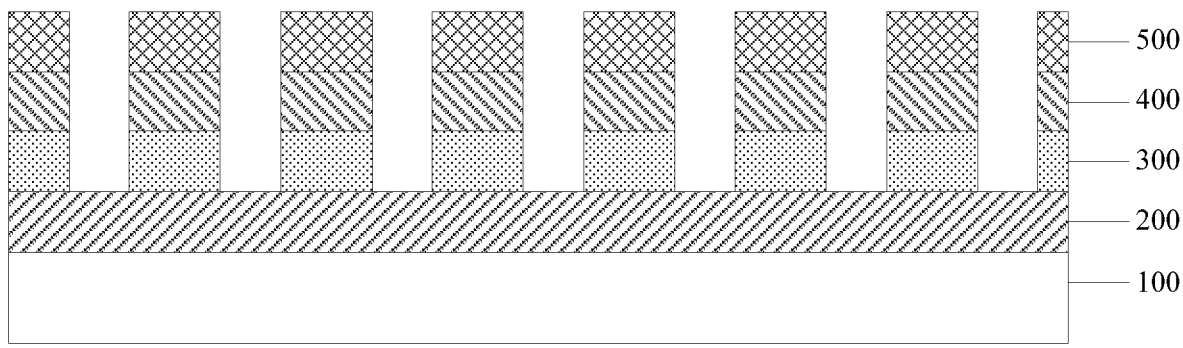
Figure 5D:
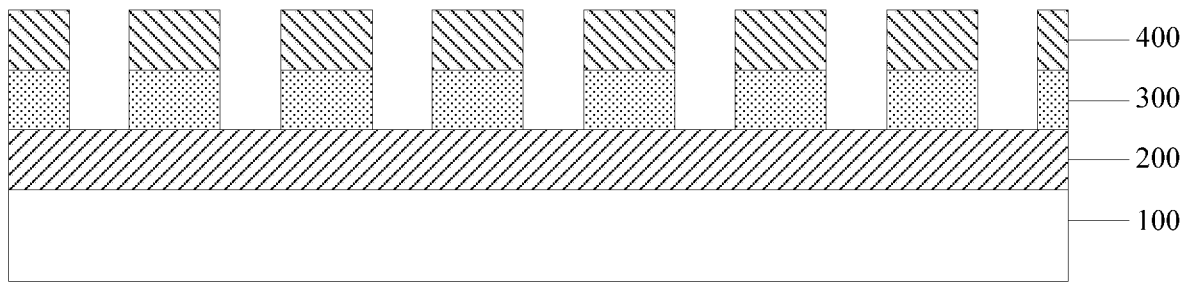
Figure 5E:
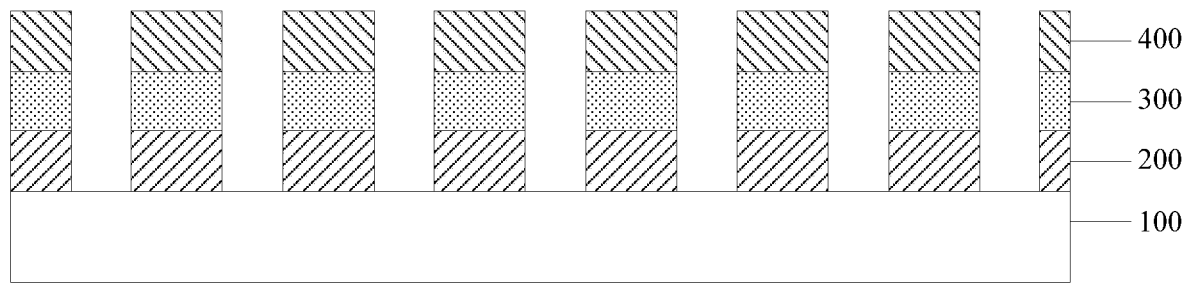
Figure 5F:
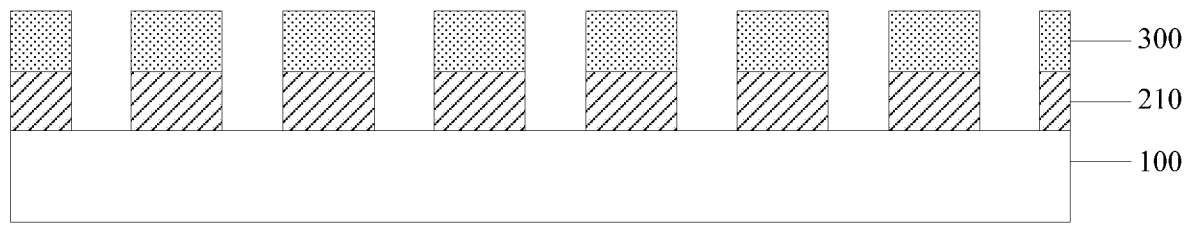
Figure 5G:
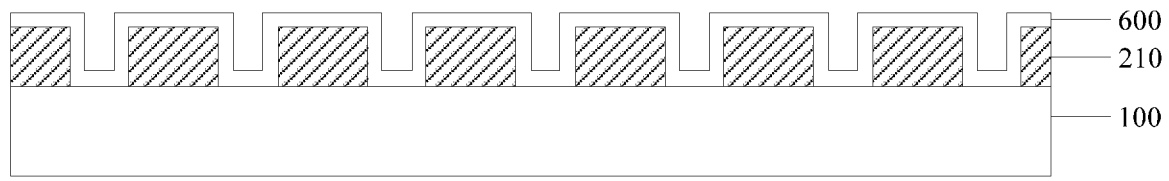

1. As shown in FIG. 5a, forming a metal layer 200, an antireflective layer 300, a hard mask layer 400 and a deep UV photoresist layer 500 sequentially on a base substrate 100.
2. As shown in FIG. 5b, etching the deep UV photoresist layer 500 by a photolithography process to form a grating mask pattern.
3. As shown in FIG. 5c, etching the antireflective layer 300 and the hard mask layer 400 simultaneously by a dry etching process with the help of the grating mask pattern, so as to form an etch mask pattern and a hard mask pattern that are identical to the grating mask pattern.
4. As shown in FIG. 5d, peeling off the grating mask pattern.
5. As shown in FIG. 5e, etching the metal layer 200 by a dry etching process with the help of the etch mask pattern and the hard mask pattern, so as to form metal grating strips 210.
6. As shown in FIG. 5f, removing the hard mask pattern.
7. As shown in FIG. 5g, forming a protective film 600 on a surface of the metal grating strips 210 while removing the etch mask pattern by a plasma process.

According to another embodiment, the antireflective layer is reused as a hard mask layer. In this case, the procedure for manufacturing a metal grating comprises process steps as follows.

Figure 6A:
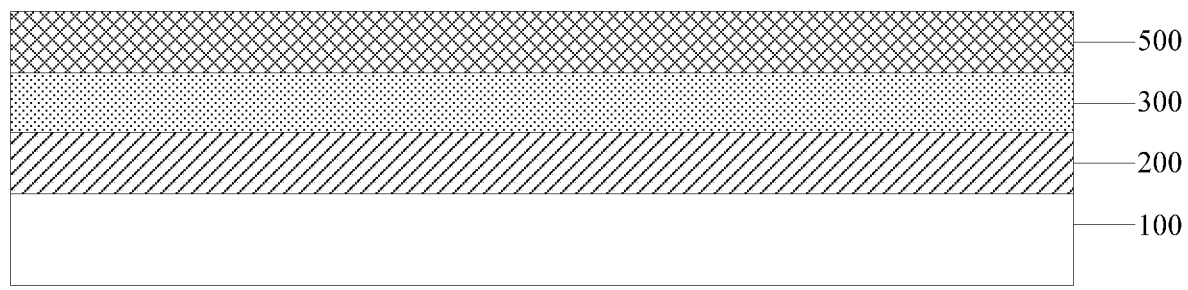
FIGS. 6a-6f are respectively schematic structure views after different steps in the manufacturing method for a metal grating according to another embodiment of the present disclosure.
Figure 6B:
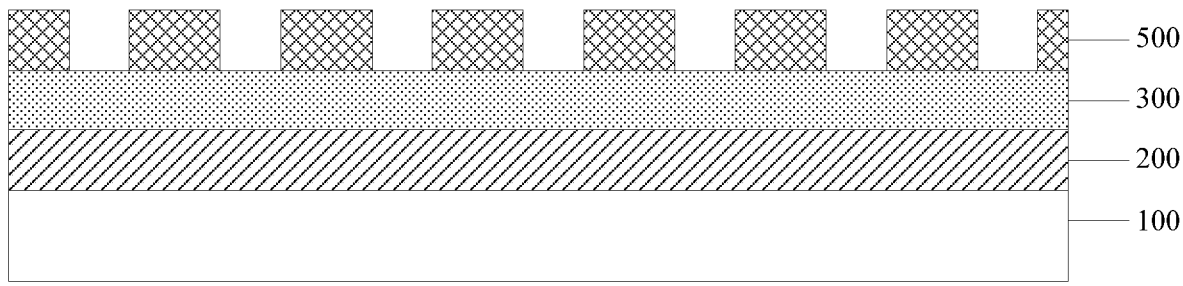
Figure 6C:
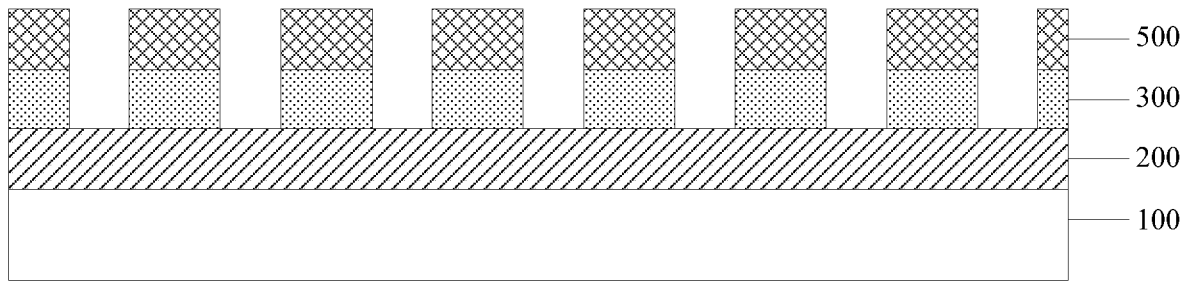
Figure 6D:
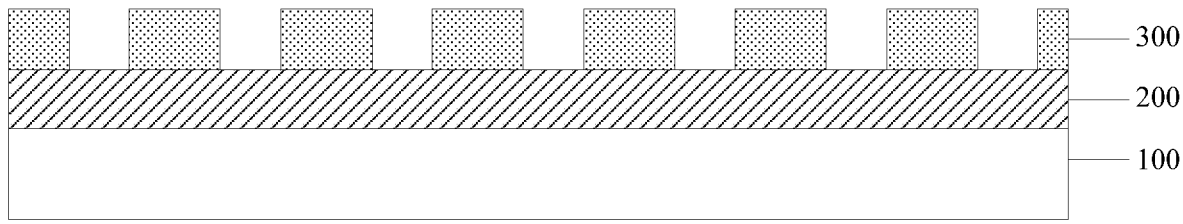
Figure 6E:
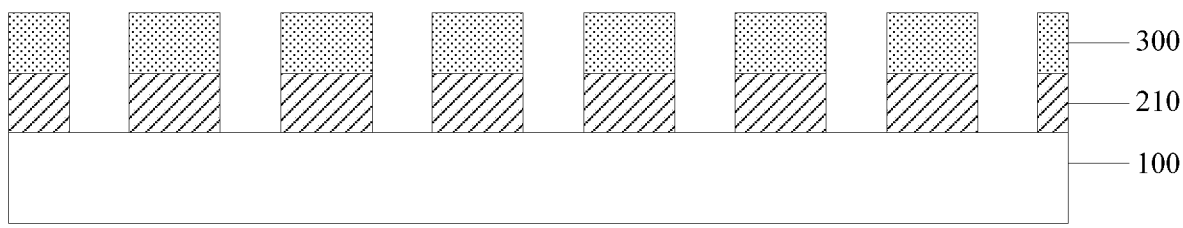
Figure 6F:
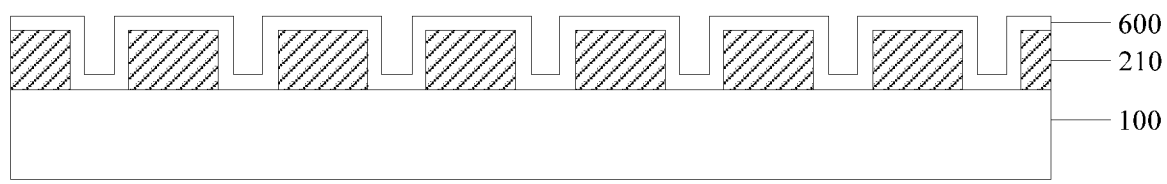

1. As shown in FIG. 6a, forming a metal layer 200, an antireflective layer 300 and a deep UV photoresist layer 500 sequentially on a base substrate 100. Optionally, the etch selectivity between the antireflective layer 300 and the deep UV photoresist layer 500 is relatively greater.
2. As shown in FIG. 6b, etching the deep UV photoresist layer 500 by a photolithography process to form a grating mask pattern.
3. As shown in FIG. 6c, etching the antireflective layer 300 by a dry etching process with the help of the grating mask pattern, so as to form an etch mask pattern identical to the grating mask pattern.
4. As shown in FIG. 6d, peeling off the grating mask pattern.
5. As shown in FIG. 6e, etching the metal layer 200 by a dry etching process with the help of the etch mask pattern, so as to form metal grating strips 210.
6. As shown in FIG. 6f, forming a protective film 600 on a surface of the metal grating strips 210 while removing the etch mask pattern by a plasma process.

According to yet another embodiment, the antireflective layer comprises a plurality of antireflective sublayers having different refractive indexes, and such an antireflective layer is further reused as a hard mask layer. In this case, the procedure for manufacturing a metal grating comprises process steps as follows.

Figure 7A:
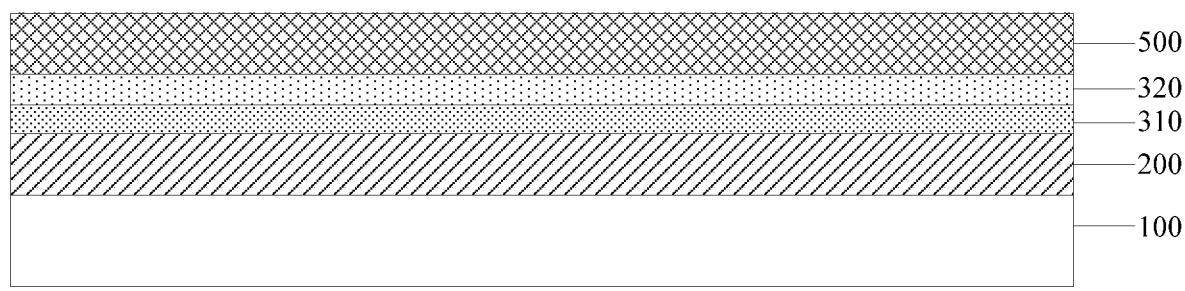
FIGS. 7a-7f are respectively schematic structure views after different steps in the manufacturing method for a metal grating according to yet another embodiment of the present disclosure.
Figure 7B:
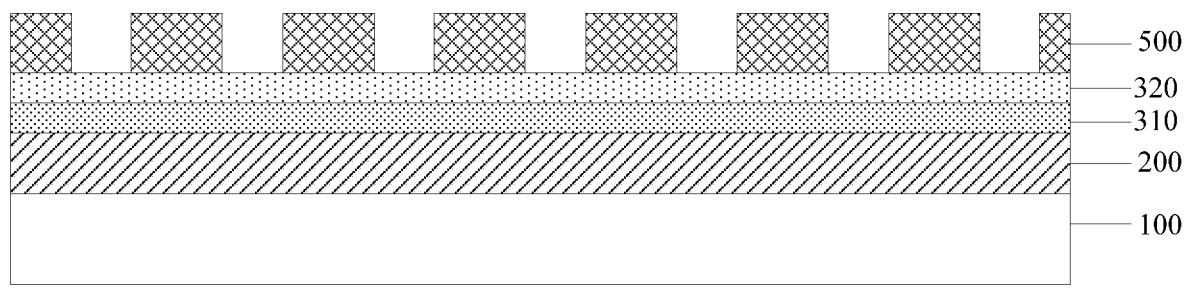
Figure 7C:
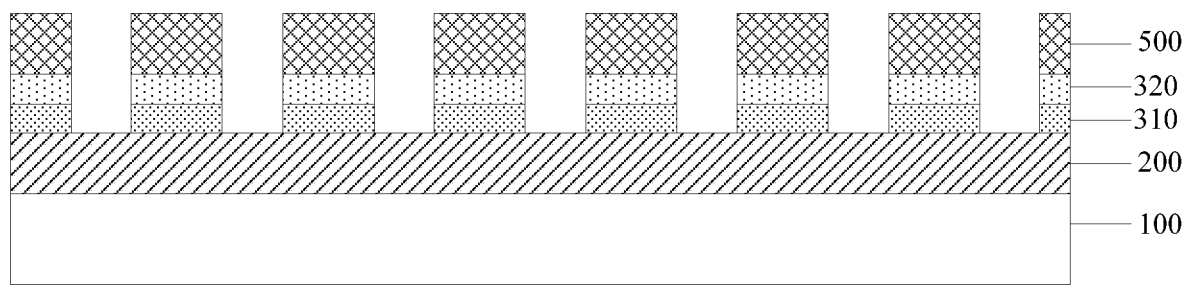
Figure 7D:
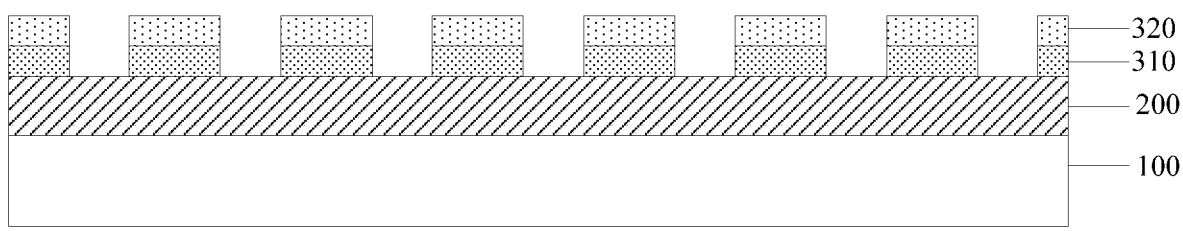
Figure 7E:
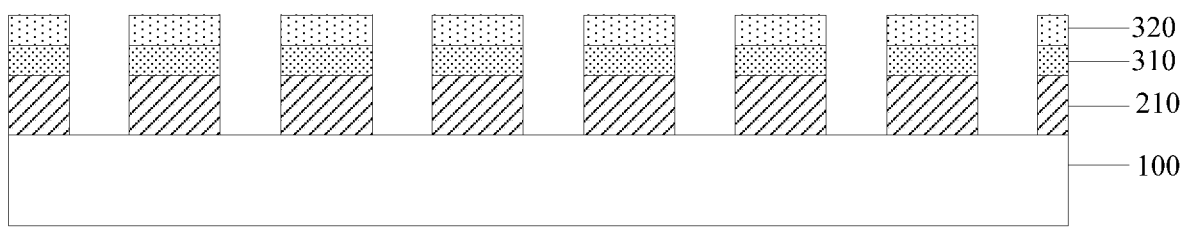
Figure 7F:
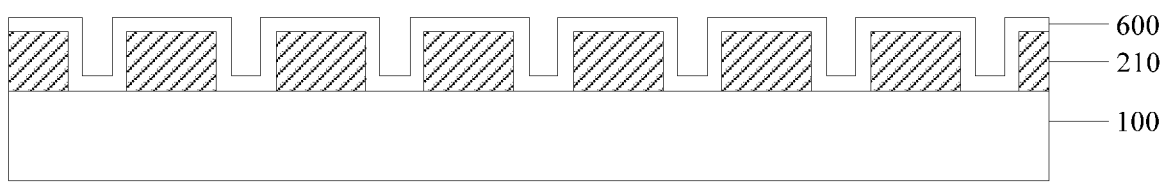

1. As shown in FIG. 7a, forming a metal layer 200, a first antireflective sublayer 310, a second antireflective sublayer 320 and a deep UV photoresist layer 500 sequentially on a base substrate 100. Optionally, the refractive index of the first antireflective sublayer 310 is higher than that of the second antireflective sublayer 320.
2. As shown in FIG. 7b, etching the deep UV photoresist layer 500 by a photolithography process to form a grating mask pattern.
3. As shown in FIG. 7c, etching the first antireflective sublayer 310 and the second antireflective sublayer 320 by a dry etching process with the help of the grating mask pattern, so as to form an etch mask pattern identical to the grating mask pattern.
4. As shown in FIG. 7d, peeling off the grating mask pattern.
5. As shown in FIG. 7e, etching the metal layer 200 by a dry etching process with the help of the etch mask pattern, so as to form metal grating strips 210.
6. As shown in FIG. 7f, forming a protective film 600 on a surface of the metal grating strips 210 while removing the etch mask pattern by a plasma process.

In another aspect, an embodiment of the present disclosure further provide a metal grating manufactured by using the manufacturing method provided in an embodiment of the present disclosure.

Based on a same concept, an embodiment of the present disclosure further provides a display device. The display device can be any product or component having a display function, such as a cellphone, a tablet computer, a television, a display, a notebook computer, a digital photo frame, a navigator and the like. For implementations of the display device, the above embodiments of the metal grating can be referred to, which will not be repeated here for simplicity.

Specifically, an embodiment of the present disclosure provides a display device. The display device can comprise: a display panel; and the metal grating as mentioned above, which is arranged inside the display panel as a polarizer.

Specifically, in the display device provided by an embodiment of the present disclosure, the thickness of the display device can be greatly reduced by using the metal grating as a polarizer and arranging it inside the display panel.

Figure 8A:
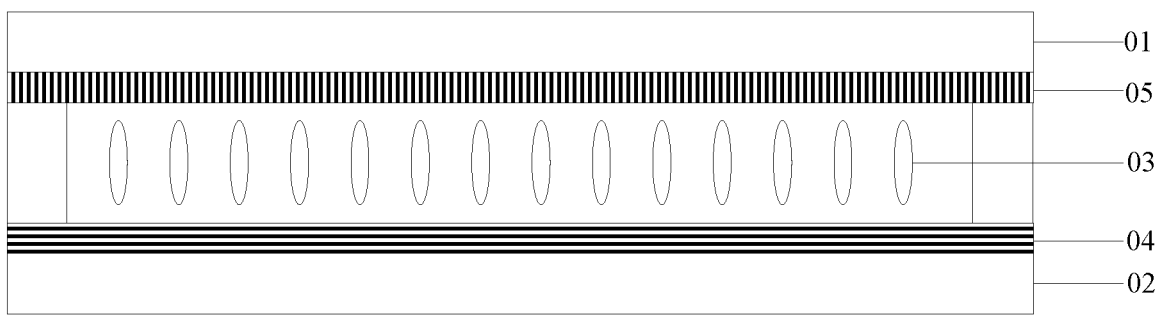
FIGS. 8a-8b are respectively schematic structure views for a display device according to an embodiment of the present disclosure.

According to a specific example, in the display device provided by an embodiment of the present disclosure, as shown in FIG. 8a, the display panel can be a liquid crystal display panel. Specifically, the liquid crystal display panel comprises: a counter substrate 01 and an array substrate 02 arranged opposite to each other; a liquid crystal layer 03 arranged between the counter substrate 01 and the array substrate 02; and the metal grating as mentioned above. Furthermore, the metal grating comprises: a first metal grating 04 arranged on one side of the array substrate 02 facing the liquid crystal layer 03; and a second metal grating 05 arranged on one side of the counter substrate 01 facing the liquid crystal layer 03, wherein an extension direction of the first metal grating 04 is perpendicular to that of the second metal grating 05. By doing this, a polarizer allowing passage of polarized light having a first direction and a second direction respectively is obtained, wherein the first direction and the second direction are perpendicular to each other.

Figure 8B:
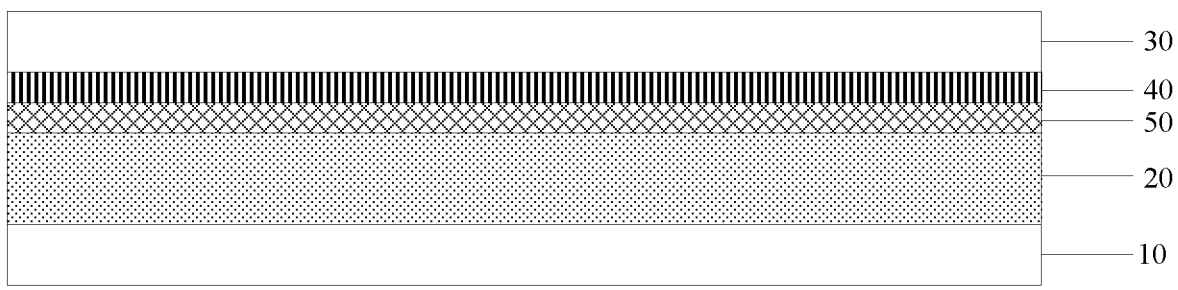

According to a specific example, in the display device provided by an embodiment of the present disclosure, as shown in FIG. 8b, the display panel can be further an organic electroluminescent display panel. The organic electroluminescent display panel can comprise: a base substrate 01; a light emitting device 20 arranged on the base substrate 10; an encapsulation layer 30 covering the light emitting device 20; the metal grating 40 as mentioned above; and a quarter-wave plate 50. Specifically, the metal grating 40 is arranged between the encapsulating layer 30 and the light emitting device 20, and the quarter-wave plate 50 is arranged between the light emitting device 20 and the metal grating 40. The quarter-wave plate 50 and the metal grating 40 serving as a circular polarizer cooperate with each other to achieve an anti-reflection function.

According to the manufacturing method for a metal grating, the metal grating and the display device as provided in embodiments of the present disclosure, an optical Talbot effect is utilized when a photolithography process is performed on the deep UV photoresist layer. Thus, it is necessary to form an antireflective layer on a surface of the metal layer, so as to guarantee that the optical intensity of the deep UV light impinging on the deep UV photoresist layer and the distribution thereof will not be influenced when the photolithography process is performed. As compared with an existing manufacturing approach in which the antireflective layer is arranged above the hard mask and not in contact with the metal layer, in an embodiment of the present disclosure, the antireflective layer is directly formed on the metal layer. Therefore, in a subsequent plasma process, a protective film can be formed on a surface of the metal strips simultaneously when the antireflective layer with an etch mask pattern is removed. That is, the step of forming a protective layer separately in the existing manufacturing approach can be omitted, which can simplify the manufacturing steps and improve the production efficiency.

Obviously, those skilled in the art can make various modifications and variations to the present disclosure without departing from spirits and scopes of the present disclosure. Thus if the modifications and variations to the present disclosure fall within the scopes of claims of the present disclosure and the equivalent techniques thereof, the present disclosure is intended to include them too.

The invention claimed is:

1. A manufacturing method for a metal grating, comprising:
   forming a metal layer, an antireflective layer, a hard mask layer and a deep UV photoresist layer sequentially on a base substrate;
   patterning the deep UV photoresist layer by a photolithography process, so as to form a grating mask pattern;
   etching the antireflective layer and the hard mask layer simultaneously by a first dry etching process with the help of the grating mask pattern, so as to form an etch mask pattern and in the antireflective layer a hard mask pattern which are identical to the grating mask pattern wherein an etch selectivity between the deep UV photoresist layer and the antireflective layer is not smaller than that between the deep UV photoresist layer and the hard mask layer;
   removing the grating mask pattern;
   etching the metal layer by a second dry etching process with the help of the etch mask pattern, so as to form metal grating strips; and
   removing the hard mask pattern and the etch mask pattern, thus forming a metal grating.

2. The manufacturing method according to claim 1, wherein
   removing the etch mask pattern by a plasma process.

3. The manufacturing method according to claim 2, wherein
   forming a protective film over the metal grating strips while removing the etch mask pattern by the plasma process.

4. The manufacturing method according to claim 3, wherein
   performing oxidization treatment on a surface of the metal grating strips by using the oxygen plasma, so as to form the protective film.

5. The manufacturing method according to claim 1, wherein
   the antireflective layer comprises a plurality of antireflective sublayers with different refractive indexes.

6. The manufacturing method according to claim 5, wherein
   in a direction from the metal layer to the deep UV photoresist layer, the refractive index of a (2n)th antireflective sublayer is smaller than that of a (2n−1)th antireflective sublayer and that of a (2n+1)th antireflective sublayer, wherein n is an integer greater than or equal to 1.

7. The manufacturing method according to claim 5, wherein
   in a direction from the metal layer to the deep UV photoresist layer, the refractive index of a (2n)th antireflective sublayer is greater than that of a (2n−1)th antireflective sublayer and that of a (2n+1)th antireflective sublayer, wherein n is an integer greater than or equal to 1.

* * * * *